(12) United States Patent
Yang

(10) Patent No.: US 11,715,540 B2
(45) Date of Patent: Aug. 1, 2023

(54) ANTI-FUSE DEVICE

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 0 days.

(21) Appl. No.: 17/569,450

(22) Filed: Jan. 5, 2022

(65) Prior Publication Data
US 2023/0215505 A1  Jul. 6, 2023

(51) Int. Cl.
*G11C 17/16* (2006.01)
*G11C 17/18* (2006.01)

(52) U.S. Cl.
CPC .............. *G11C 17/16* (2013.01); *G11C 17/18* (2013.01)

(58) Field of Classification Search
CPC ................................. G11C 17/16; G11C 17/18
USPC .......................................................... 365/96
See application file for complete search history.

(56) References Cited

U.S. PATENT DOCUMENTS

| | | | |
|---|---|---|---|
| 6,266,291 B1* | 7/2001 | Sher ........................ | G11C 17/16 365/189.09 |
| 10,236,072 B1 | 3/2019 | Sreeramaneni et al. | |
| 10,672,489 B2 | 6/2020 | Riley et al. | |
| 2004/0129952 A1* | 7/2004 | Griesmer ................. | G11C 11/56 257/202 |
| 2004/0217441 A1* | 11/2004 | Lehmann ............ | H01L 23/5252 438/467 |
| 2009/0045867 A1* | 2/2009 | Kwong .................... | G11C 17/16 327/525 |
| 2009/0251201 A1* | 10/2009 | Sung .................. | H01L 27/11206 438/600 |
| 2013/0051133 A1* | 2/2013 | Son ........................ | G11C 11/161 365/158 |
| 2013/0286759 A1* | 10/2013 | Park ...................... | G11C 29/027 365/201 |

OTHER PUBLICATIONS

"Office Action of Taiwan Counterpart Application", dated Sep. 2, 2022, p. 1-p. 5.

* cited by examiner

*Primary Examiner* — Muna A Techane
(74) *Attorney, Agent, or Firm* — JCIPRNET

(57) ABSTRACT

The disclosure provides an anti-fuse device including an anti-fuse unit and a sensing circuit. The anti-fuse unit includes a first anti-fuse and a second anti-fuse serially connected between a first terminal of the anti-fuse unit and a second terminal of the anti-fuse unit. The sensing circuit is coupled to the first terminal and the second terminal of the anti-fuse unit for sensing a blown state of the anti-fuse unit.

6 Claims, 6 Drawing Sheets

ANTI-FUSE DEVICE

BACKGROUND

Technology Field

The disclosure relates to an information latch circuit, and particularly relates to an anti-fuse device.

Description of Related Art

Anti-fuses can be applied to various electronic circuits to latch different information (anti-fuse latch information). For example, dynamic random-access memory (DRAM) chips use an anti-fuse to determine which redundant row and/or redundant column to turn on. For the anti-fuse, a blown anti-fuse has a low resistance value, while an un-blown anti-fuse has a high resistance value. Based on the material of the anti-fuse, in some embodiments, the resistance value of the blown anti-fuse may range from 2 to 100 KΩ, while the resistance value of the un-blown anti-fuse may range from 5000 to 20000 KΩ. A sensing circuit can sense the resistance state of the anti-fuse and then acquire the blown state of the anti-fuse. However, sometimes due to certain reasons, the resistance value of the un-blown anti-fuse may be abnormally low (e.g., less than 100KΩ). The phenomenon of the un-blown anti-fuse with an abnormally low resistance value instead is called un-expected blown. On the contrary, sometimes due to some reasons, the resistance value of the blown anti-fuse may be abnormally high (e.g., greater than 5000KΩ). The abnormal phenomena of either "the blown anti-fuse with an abnormally high resistance value" or "the un-blown anti-fuse with an abnormally low resistance value" may result in misjudgment by the subsequent circuit. How to improve the robustness of anti-fuse latch information is one of many important topics in the technical field.

SUMMARY

The disclosure provides an anti-fuse device to improve the robustness of anti-fuse latch information of an anti-fuse unit.

In an embodiment of the disclosure, the anti-fuse device includes an anti-fuse unit and a sensing circuit. The anti-fuse unit includes a first anti-fuse and a second anti-fuse connected in series between a first terminal of the anti-fuse unit and a second terminal of the anti-fuse unit. The sensing circuit is coupled to the first terminal and the second terminal of the anti-fuse unit for sensing a blown state of the anti-fuse unit.

In summary, the anti-fuse unit in the embodiments of the disclosure includes a first anti-fuse and a second anti-fuse connected in series. When one of the first anti-fuse and the second anti-fuse in the anti-fuse unit in the un-blown state is un-expected blown, the other one of the first anti-fuse and the second anti-fuse can be maintained in the un-blown state to provide a normal high resistance value. Accordingly, the anti-fuse unit in the un-blown state can be maintained in the high resistance state to correctly indicate the "un-blown state". Therefore, the anti-fuse device can improve the robustness of the anti-fuse latch information.

In order to make the features and advantages of the disclosure comprehensible, embodiments accompanied with drawings are described in detail below.

DESCRIPTION OF THE EMBODIMENTS

Figure 1:
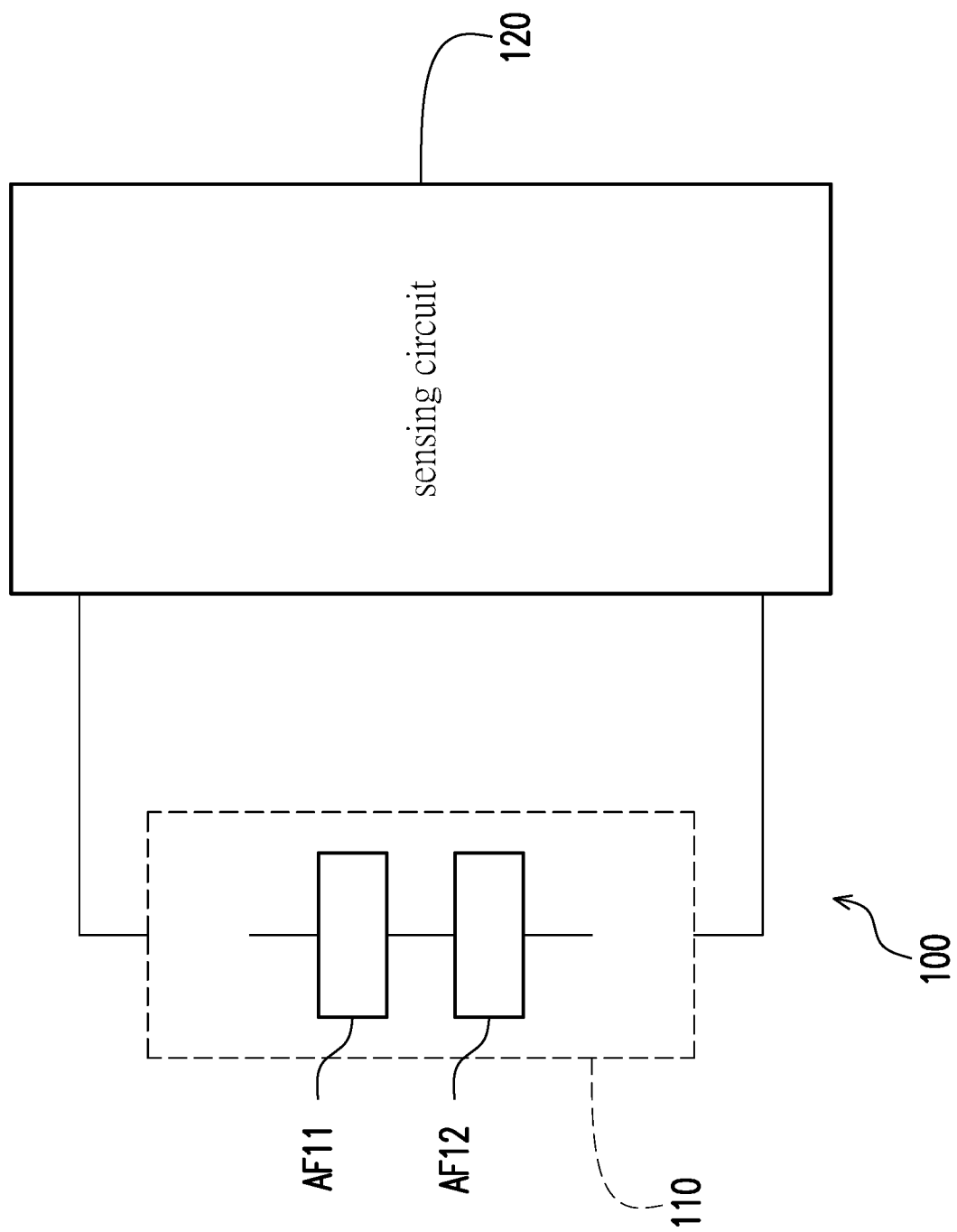
FIG. 1 is a schematic view of a circuit block of an anti-fuse device according to an embodiment of the disclosure.

The terms "couple/connect" used in this specification (including claims) may refer to any direct or indirect connection means. For example, "a first device is coupled (or connected) to a second device" should be interpreted as "the first device is directly connected to the second device" or "the first device is indirectly connected to the second device through other devices or connection means." The terms "first", "second", and so on used in this specification (including claims) are used to name the elements or distinguish different embodiments or ranges from each other, and should not be construed as the upper limit or lower limit of the number of the elements or as a limitation to the order of the elements. Moreover, wherever appropriate in the drawings and embodiments, elements/components/steps with the same reference numerals represent the same or similar parts. Elements/components/steps with the same reference numerals or names in different embodiments may be cross-referenced.

FIG. 1 is a schematic view of a circuit block of an anti-fuse device 100 according to an embodiment of the disclosure. The anti-fuse device 100 shown in FIG. 1 includes an anti-fuse unit 110 and a sensing circuit 120. The anti-fuse unit 110 includes an anti-fuse AF11 and an anti-fuse AF12 connected in series between a first terminal of the anti-fuse unit 110 and a second terminal of the anti-fuse unit 110. The sensing circuit 120 is coupled to the first terminal and the second terminal of the anti-fuse unit 110. The sensing circuit 120 can sense the blown state of the anti-fuse unit 110.

The sensing circuit 120 can sense the resistance states of the anti-fuse AF11 and the anti-fuse AF12 and then acquire the blown state of the anti-fuse unit 110. The blown anti-fuse has a low resistance value, while the un-blown anti-fuse has a high resistance value. Based on the material of an anti-fuse, in some embodiments, the resistance value of the blown anti-fuse may range from 2 to 100 KΩ, while the resistance value of the un-blown anti-fuse may range from 5000 to 20000 KΩ. For a convenient explanation, herein it is assumed that the resistance value of the blown anti-fuse is 100KΩ(a low resistance value), and the resistance value of the un-blown anti-fuse is 5000KΩ(a high resistance value). When the blown state of the anti-fuse unit 110 is "un-blown", the anti-fuse AF11 and the anti-fuse AF12 both have a high resistance value, so the total resistance value of the anti-fuse AF11 and the anti-fuse AF12 is 5000KΩ+ 5000KΩ=10000KΩ. When the blown state of the anti-fuse unit 110 is "blown", the anti-fuse AF11 and the anti-fuse AF12 both have a low resistance value, so the total resistance value of the anti-fuse AF11 and the anti-fuse AF12 is 100KΩ+100KΩ=200KΩ. Therefore, the sensing circuit 120 can easily determine the blown state of the anti-fuse unit 110 based on the total resistance value of the anti-fuse AF11 and the anti-fuse AF12.

However, sometimes due to certain reasons, although the probability of occurrence is extremely small (the probability of occurrence may be one in ten thousand), the resistance value of the un-blown anti-fuse is an abnormally low resistance value (e.g., less than or equal to 100KΩ). The phenomenon of the un-blown anti-fuse with an abnormally low resistance value instead is called un-expected blown. Herein, it is assumed that the anti-fuse AF11 is un-expected blown, so that the resistance value of the anti-fuse AF11 is 100KΩ(an abnormally low resistance). When the anti-fuse AF11 is un-expected blown, which should be in the un-blown state, the anti-fuse AF12 can be maintained in the un-blown state and provide a normal high resistance value (e.g., 5000KΩ). Therefore, the total resistance value of the anti-fuse AF11 and the anti-fuse AF12 is 100KΩ+ 5000KΩ=5100KΩ, and the total resistance value of 5100KΩ is much greater than the total resistance value of 200KΩ of the "blown state". Accordingly, even if the anti-fuse AF11 is un-expected blown, the anti-fuse unit 110 in the un-blown state can be maintained in the high resistance state to correctly indicate the "un-blown state". Therefore, the anti-fuse device 100 can improve the robustness of the anti-fuse latch information.

Figure 2:
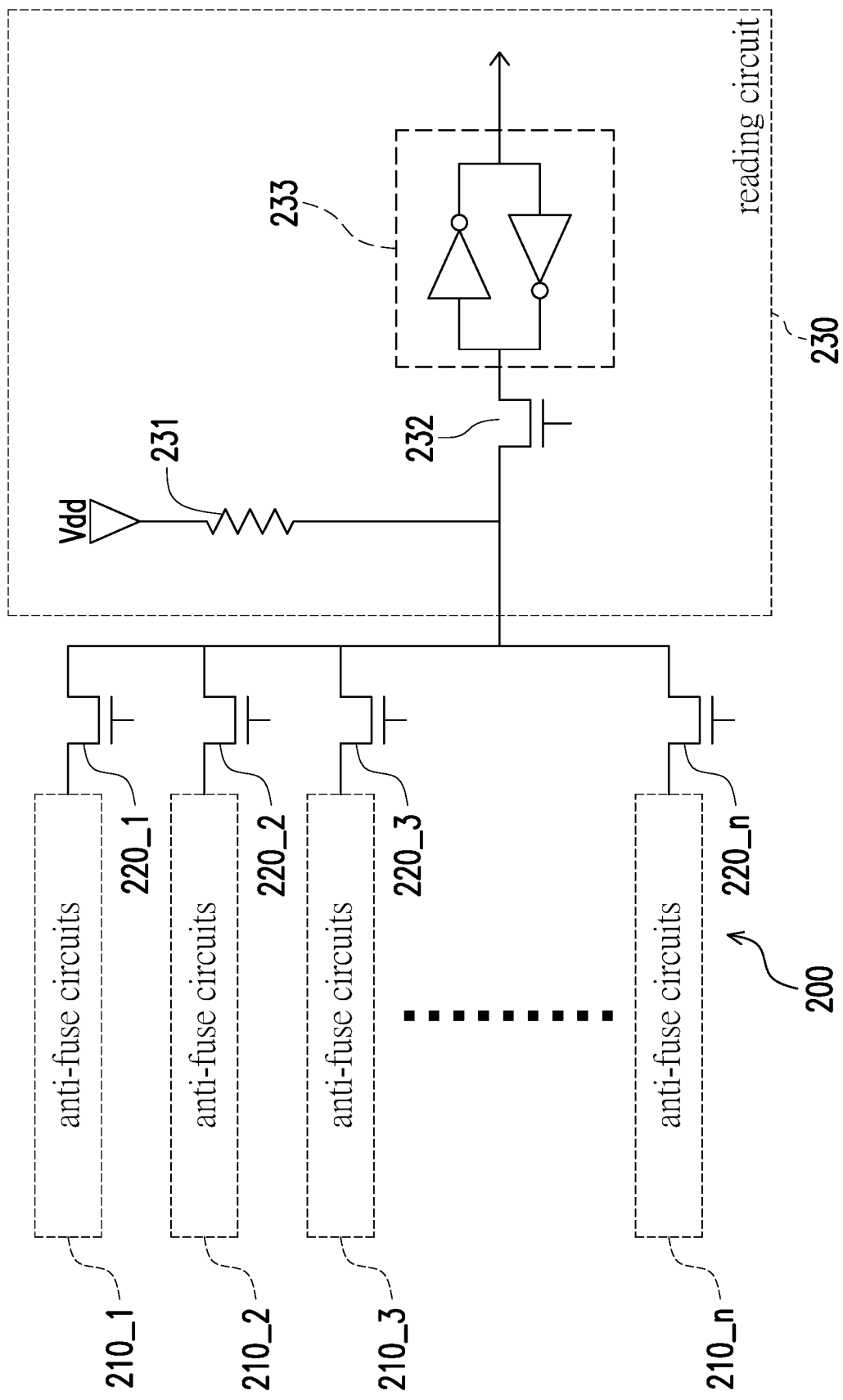
FIG. 2 is a schematic view of a circuit block of an anti-fuse device according to another embodiment of the disclosure.

FIG. 2 is a schematic view of a circuit block of an anti-fuse device 200 according to another embodiment of the disclosure. The anti-fuse device 200 shown in FIG. 2 can be analogically reasoned by referring to the related description of the anti-fuse device 100 shown in FIG. 1. The anti-fuse device 200 shown in FIG. 2 can be used as one of many implementation examples of the anti-fuse device 100 shown in FIG. 1. The anti-fuse device 200 shown in FIG. 2 includes multiple anti-fuse circuits (e.g., anti-fuse circuits 210_1, 210_2, 210_3, . . . , 210_n), multiple reading switches (e.g., reading switches 220_1, 220_2, 220_3, . . . , 220_n), and a reading circuit 230. The number n of the anti-fuse circuits can be determined according to the actual design. The first terminals of the reading switches 220_1 to 220_n are coupled to the anti-fuse circuits 210_1 to 210_n in a one-to-one manner. The second terminals of the reading switches 220_1 to 220_n are coupled to the reading circuit 230. Based on the switching operations of the reading switches 220_1 to 220_n, the anti-fuse circuits 210_1 to 210_n can share the reading circuit 230 in a time-sharing manner. The reading circuit 230 can sense the anti-fuse resistance states of the anti-fuse circuits 210_1 to 210_n at different times and then acquire the blown states of the anti-fuse circuits 210_1 to 210_n. Any one of the anti-fuse circuits 210_1 to 210_n shown in FIG. 2 and the reading circuit 230 shown in FIG. 2 can be analogically reasoned by referring to the related descriptions of the anti-fuse unit 110 and the sensing circuit 120 shown in FIG. 1. Any one of the anti-fuse circuits 210_1 to 210_n shown in FIG. 2 and the reading circuit 230 shown in FIG. 2 can be used as one of many implementation examples of the anti-fuse unit 110 and the sensing circuit 120 shown in FIG. 1 (which is illustrated in the subsequent paragraphs).

In the embodiment shown in FIG. 2, the reading circuit 230 includes a reading resistor 231, a reading switch 232, and a latch circuit 233. The first terminal of the reading resistor 231 is coupled to a power voltage source Vdd, and the second terminal of the reading resistor 231 is coupled to the second terminals of the reading switches 220_1 to 220_n. The voltage level of the power voltage source Vdd and the resistance value of the reading resistor 231 can be determined according to actual design. For example (but not limited to this), the voltage level of the power voltage source Vdd may be 12 V (volts), and the resistance value of the reading resistor 231 may be a resistance value ranging from 0Ω to 1500KΩ. The first terminal of the reading switch 232 is coupled to the second terminals of the reading switches 220_1 to 220_n. When reading the anti-fuse circuits 210_1 to 210_n, the reading switch 232 is turned on. When the anti-fuse circuits 210_1 to 210_n are not read, the reading switch 232 is turned off. The latch circuit 233 is coupled to the second terminal of the reading switch 232. When the reading switch 232 is turned on, the latch circuit 233 can latch the blown state of one of the anti-fuse circuits 210_1 to 210_n.

Figure 3:
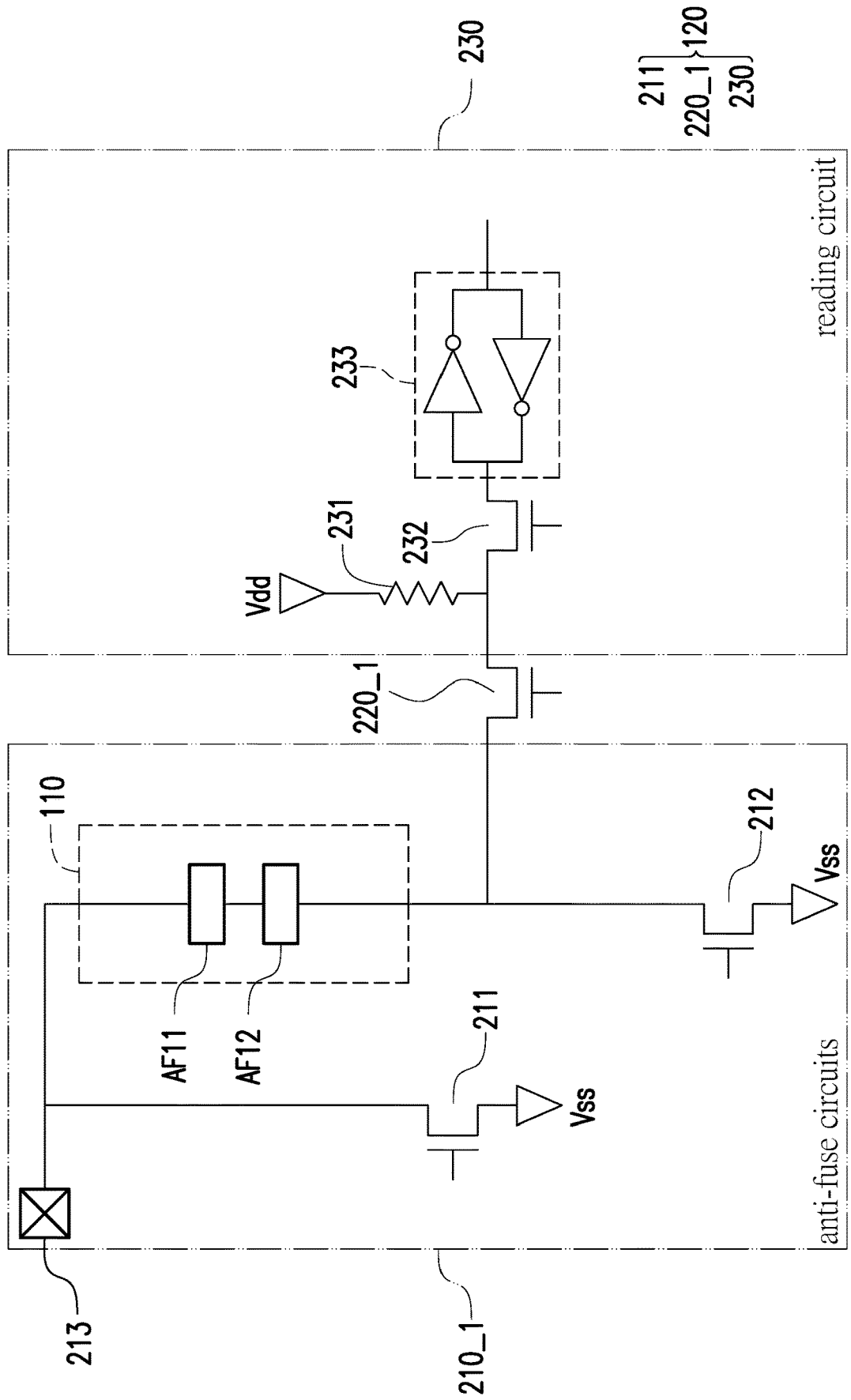
FIG. 3 is a schematic view of a circuit block of the anti-fuse circuit shown in FIG. 2 according to an embodiment of the disclosure.

FIG. 3 is a schematic view of a circuit block of the anti-fuse circuit 210_1 shown in FIG. 2 according to an embodiment of the disclosure. The anti-fuse circuit 210_1 shown in FIG. 3 can be used as one of many implementation examples of the anti-fuse circuit 210_1 shown in FIG. 2. The anti-fuse circuits 210_2 to 210_n and the reading switches 220_2 to 220_n shown in FIG. 2 can be analogically reasoned by referring to the related descriptions of the anti-fuse circuit 210_1 and the reading switch 220_1 shown in FIG. 3.

In the embodiment shown in FIG. 3, the anti-fuse circuit 210_1 includes the anti-fuse unit 110, a reading switch 211, a blowing switch 212, and a blown pad 213. The blown pad 213 is coupled to the first terminal of the anti-fuse unit 110. When the anti-fuse unit 110 is blown, the blown pad 213 may be coupled to an external blowing voltage source (not shown) to provide a blowing voltage to the first terminal of the anti-fuse unit 110. The first terminal of the blowing switch 212 is coupled to the second terminal of the anti-fuse unit 110, and the second terminal of the blowing switch 212 is coupled to a reference voltage source Vss. The level of the reference voltage source Vss can be determined according to the actual design. For example, the reference voltage source Vss can provide a ground voltage or other fixed voltages.

In the embodiment shown in FIG. 3, the anti-fuse unit 110 includes the anti-fuse AF11 and the anti-fuse AF12. The first terminal of the anti-fuse AF11 is coupled to the first terminal of the anti-fuse unit 110. The second terminal of the anti-fuse AF11 is coupled to the first terminal of the anti-fuse AF12. The second terminal of the anti-fuse AF12 is coupled to the second terminal of the anti-fuse unit 110. For the anti-fuse unit 110, the anti-fuse AF11, and the anti-fuse AF12 shown in FIG. 3, refer to the related descriptions of the anti-fuse unit 110, the anti-fuse AF11, and the anti-fuse AF12 shown in FIG. 1, which are not repeated herein.

When the anti-fuse unit 110 is blown, the blown pad 213 can be coupled to an external blowing voltage source (not shown), the blowing switch 212 is turned on, and the reading switches 211 and 220_1 are turned off. Therefore, the blowing current can flow from the blown pad 213 to the reference voltage source Vss through the anti-fuse AF11, the anti-fuse AF12, and the blowing switch 212. The blowing current can change the blown states of the anti-fuse AF11 and the anti-fuse AF12 from the "un-blown state" to the "blown state". When the anti-fuse unit 110 is not blown, the blowing switch 212 is turned off, and the blown pad 213 is not coupled to any external blowing voltage source.

The reading switch 211, the reading switch 2201, and the reading circuit 230 shown in FIG. 3 can be used as components of the sensing circuit 120 shown in FIG. 1. That is, in some embodiments, the sensing circuit 120 shown in FIG. 1 may include the reading switch 211, the reading switch 220_1, and the reading circuit 230 shown in FIG. 3. The first terminal of the reading switch 211 is coupled to the first terminal of the anti-fuse unit 110. The second terminal of the reading switch 211 is coupled to the reference voltage source Vss. The first terminal of the reading switch 2201 is coupled to the second terminal of the anti-fuse unit 110. The reading circuit 230 is coupled to the second terminal of the reading switch 220_1. For the reading circuit 230 shown in FIG. 3, refer to the related description of the reading circuit 230 shown in FIG. 2, which is not repeated herein.

When the anti-fuse unit 110 of the anti-fuse circuit 210_1 shown in FIG. 3 is not read, the reading switches 211 and 220_1 are turned off. When the anti-fuse unit 110 shown in FIG. 3 is read, the reading switches 211, 220_1, and 232 are turned on. Therefore, the reading current can flow from the power voltage source Vdd to the reference voltage source Vss through the reading resistor 231, the reading switch 220_1, the anti-fuse AF12, the anti-fuse AF11, and the reading switch 211. The reading circuit 230 can sense the blown state of the anti-fuse unit 110 when the reading switches 211, 220_1, and 232 are turned on.

Figure 4:
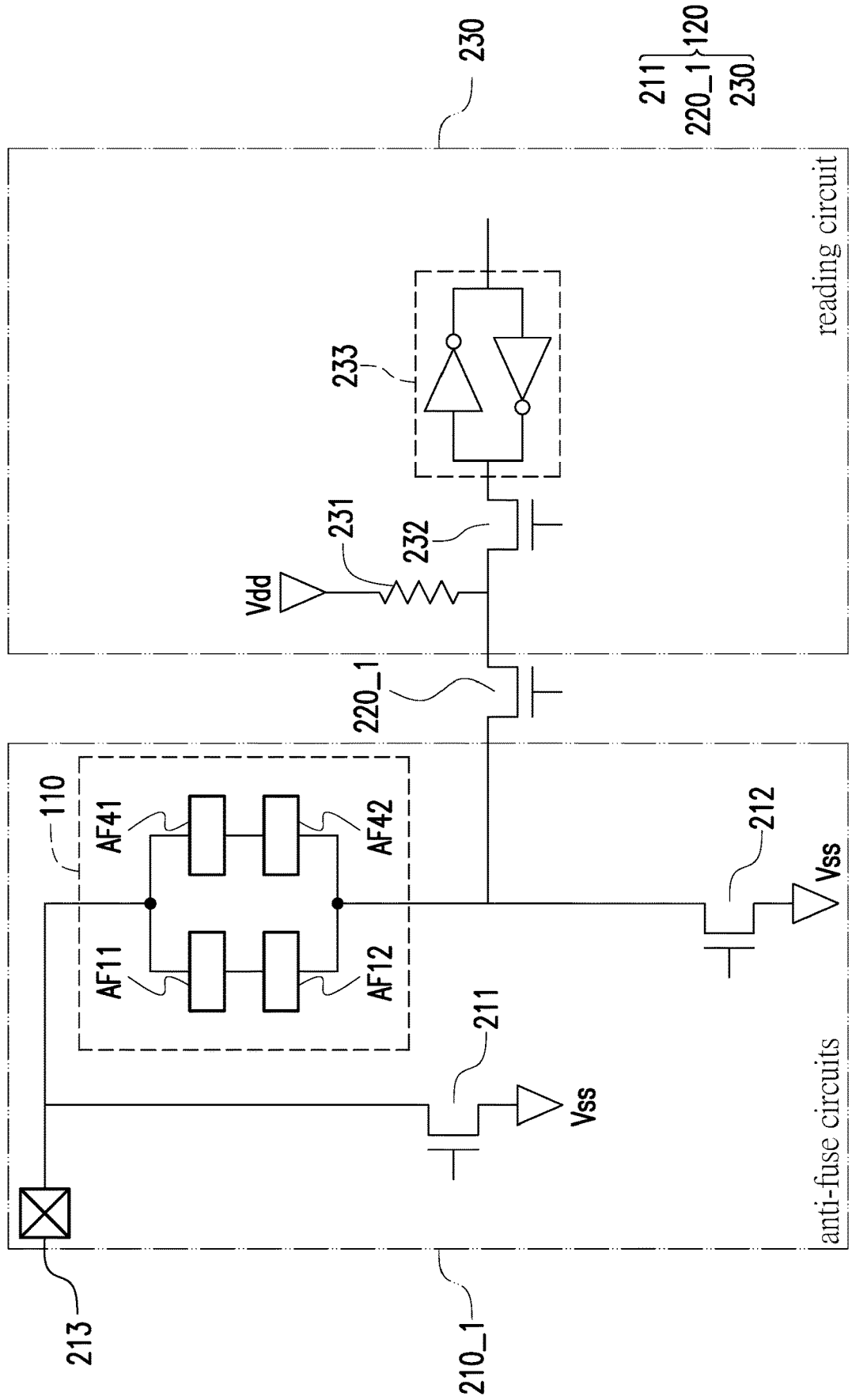
FIG. 4 is a schematic view of a circuit block of the anti-fuse circuit shown in FIG. 2 according to another embodiment of the disclosure.

FIG. 4 is a schematic view of a circuit block of the anti-fuse circuit 210_1 shown in FIG. 2 according to another embodiment of the disclosure. The anti-fuse circuit 210_1 shown in FIG. 4 can be used as one of many implementation examples of the anti-fuse circuit 210_1 shown in FIG. 2. The anti-fuse circuits 210_2 to 210_n and the reading switches 220_2 to 220_n shown in FIG. 2 can be analogically reasoned by referring to the related descriptions of the anti-fuse circuit 210_1 and the reading switch 220_1 shown in FIG. 4.

The anti-fuse circuit 210_1 shown in FIG. 4 includes the anti-fuse unit 110, the reading switch 211, the blowing switch 212, and the blown pad 213. The anti-fuse unit 110, the reading switch 211, the blowing switch 212, and the blown pad 213 shown in FIG. 4 can be analogically reasoned by referring to the related descriptions of the anti-fuse unit 110, the reading switch 211, the blowing switch 212, and the blown pad 213 shown in FIG. 3, which are not repeated herein.

In the embodiment shown in FIG. 4, the anti-fuse unit 110 includes the anti-fuse AF11, the anti-fuse AF12, an anti-fuse AF41, and an anti-fuse AF42. The anti-fuses AF11 and AF12 shown in FIG. 4 can be analogically reasoned by referring to the related descriptions of the anti-fuses AF11 and AF12 shown in FIG. 3, which are not repeated herein. The first terminal of the anti-fuse AF41 is coupled to the first terminal of the anti-fuse AF11. The first terminal of the anti-fuse AF42 is coupled to the second terminal of the anti-fuse AF41. The second terminal of the anti-fuse AF42 is coupled to the second terminal of the anti-fuse AF12. The sensing circuit 120 can sense the resistance states of the anti-fuses AF11, AF12, AF41, and AF42 and then acquire the blown state of the anti-fuse unit 110. For a convenient explanation, herein it is assumed that the resistance value of the blown anti-fuse is 100KΩ(a low resistance value), and the resistance value of the un-blown anti-fuse is 5000KΩ(a high resistance value). When the blown state of the anti-fuse unit 110 is "un-blown", the resistance values of the anti-fuses AF11, AF12, AF41 and AF42 are all 5000KΩ. Therefore, the equivalent resistance value (the total resistance value of the anti-fuses AF11, AF12, AF41, and AF42) of the anti-fuse unit 110 is 5000KΩ. When the blown state of the anti-fuse unit 110 is "blown", the resistance values of the anti-fuses AF11, AF12, AF41, and AF42 are all 100KΩ, so the equivalent resistance value of the anti-fuse unit 110 is 100KΩ. Therefore, the sensing circuit 120 can easily determine the blown state of the anti-fuse unit 110 according to the equivalent resistance value of the anti-fuse unit 110.

When any one of the anti-fuses AF11, AF12, AF41, and AF42 is un-expected blown, the sensing circuit 120 can still correctly sense the blown state of the anti-fuse unit 110 shown in FIG. 4. Herein, it is assumed that the anti-fuse AF11 is un-expected blown, and the resistance value of the anti-fuse AF11 is 100KΩ(an abnormally low resistance value). When the anti-fuse AF11 that should be in the un-blown state is un-expected blown, the anti-fuses AF12, AF41, and AF42 can be maintained in the un-blown state to provide a normal high resistance value (e.g., 5000KΩ). Therefore, the equivalent resistance value of the anti-fuse unit 110 (the total resistance value of the anti-fuses AF11, AF12, AF41, and AF42) is 3377.483443708609KΩ, and the total resistance value of 3377KΩ is much greater than the normal total resistance value of 100KΩ in the "blown state". Accordingly, even if the anti-fuse AF11 is un-expected blown, the anti-fuse unit 110 in the un-blown state can be maintained in the high resistance state to correctly indicate the "un-blown state". Therefore, the anti-fuse device 200 can improve the robustness of the anti-fuse latch information.

On the contrary, sometimes due to certain reasons, although the probability of occurrence is extremely small (the probability of occurrence may be one in ten thousand), the resistance value of the blown anti-fuse is an abnormally high resistance value (e.g., greater than or equal to 5000KΩ). The phenomenon of the blown anti-fuse with an abnormally high resistance value instead is called "unable to be blown". When any one of the anti-fuses AF11, AF12, AF41, and AF42 is "unable to be blown", the sensing circuit 120 can still correctly sense the blown state of the anti-fuse unit 110 shown in FIG. 4. Herein, it is assumed that the anti-fuse AF11 may be unable to be blown, and the resistance value of the anti-fuse AF11 is 5000KΩ(an abnormally high resistance). When the anti-fuse AF11 that should be in the blown state is "unable to be blown", the anti-fuses AF12, AF41, and AF42 can be maintained in the blown state and provide a normal low resistance value (e.g., 100KΩ). Therefore, the equivalent resistance (the total resistance value of the anti-fuses AF11, AF12, AF41, and AF42) of the anti-fuse unit 110 is 192.4528301886792KΩ, and the total resistance value of 192KΩ is much less than the normal total resistance value of 5000KΩ in the "un-blown state". Accordingly, even if the anti-fuse AF11 is "un-blown", the anti-fuse unit 110 in the blown state can be maintained in the low resistance state to correctly indicate the "blown state". Therefore, the anti-fuse device 200 can improve the robustness of the anti-fuse latch information.

Figure 5:
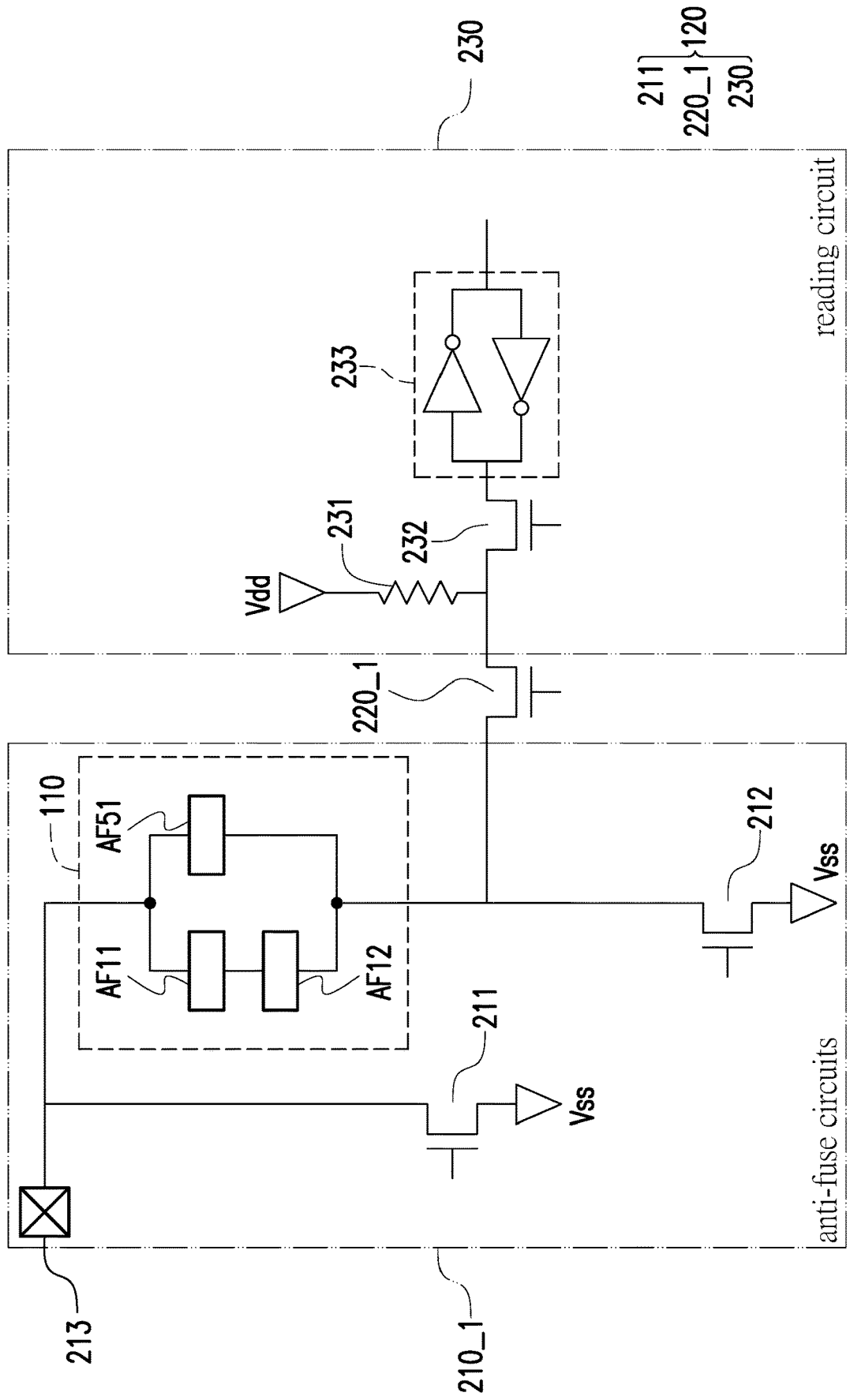
FIG. 5 is a schematic view of a circuit block of the anti-fuse circuit shown in FIG. 2 according to yet another embodiment of the disclosure.

FIG. 5 is a schematic view of a circuit block of the anti-fuse circuit 210_1 shown in FIG. 2 according to yet another embodiment of the disclosure. The anti-fuse circuit 210_1 shown in FIG. 5 can be used as one of many implementation examples of the anti-fuse circuit 210_1 shown in FIG. 2. The anti-fuse circuits 210_2 to 210_n and the reading switches 220_2 to 220_n shown in FIG. 2 can be analogically reasoned by referring to the related descriptions of the anti-fuse circuit 210_1 and the reading switch 220_1 shown in FIG. 5. The anti-fuse circuit 210_1 shown in FIG. 5 includes the anti-fuse unit 110, the reading switch 211, the blowing switch 212, and the blown pad 213. The anti-fuse unit 110, the reading switch 211, the blowing switch 212, and the blown pad 213 shown in FIG. 5 can be analogically reasoned by referring to the related descriptions of the anti-fuse unit 110, the reading switch 211, the blowing switch 212, and the blown pad 213 shown in FIG. 3, which are not repeated herein. In the embodiment shown in FIG. 5, the anti-fuse unit 110 includes the anti-fuse AF11, the anti-fuse AF12, and an anti-fuse AF51. The anti-fuses AF11 and AF12 shown in FIG. 5 can be analogically reasoned by referring to the related descriptions of the anti-fuses AF11 and AF12 shown in FIG. 3, which are not repeated herein. The first terminal of the anti-fuse AF51 is coupled to the first terminal of the anti-fuse AF11. The second terminal of the anti-fuse AF51 is coupled to the second terminal of the anti-fuse AF12.

Figure 6:
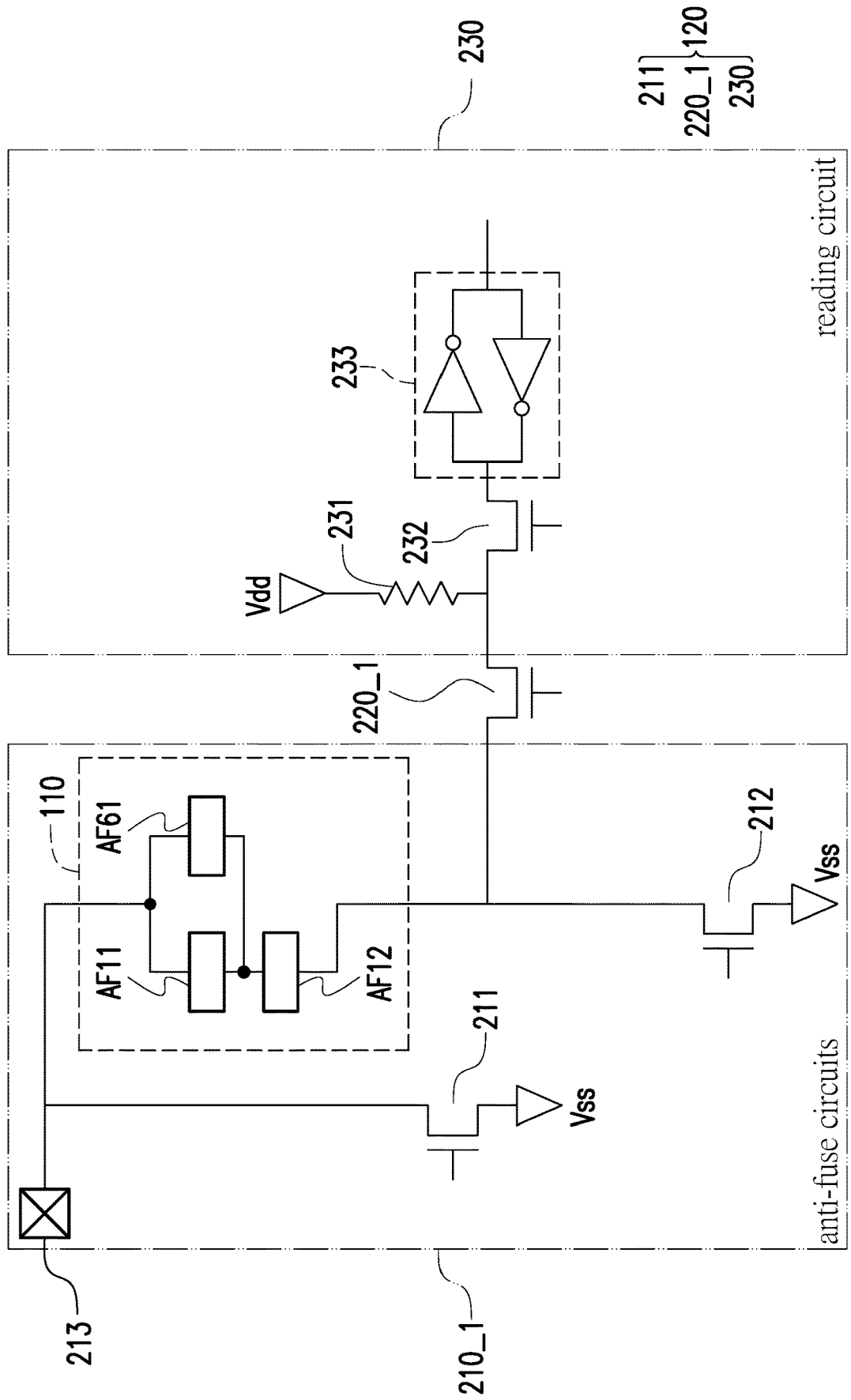
FIG. 6 is a schematic view of a circuit block of the anti-fuse circuit shown in FIG. 2 according to still another embodiment of the disclosure.

FIG. 6 is a schematic view of a circuit block of the anti-fuse circuit 210_1 shown in FIG. 2 according to still another embodiment of the disclosure. The anti-fuse circuit 210_1 shown in FIG. 6 can be used as one of many implementation examples of the anti-fuse circuit 210_1 shown in FIG. 2. The anti-fuse circuits 210_2 to 210_n and the reading switches 220_2 to 220_n shown in FIG. 2 can be analogically reasoned by referring to the related descriptions of the anti-fuse circuit 210_1 and the reading switch 220_1 shown in FIG. 6. The anti-fuse circuit 210_1 shown in FIG. 6 includes the anti-fuse unit 110, the reading switch 211, the blowing switch 212, and the blown pad 213. The anti-fuse unit 110, the reading switch 211, the blowing switch 212, and the blown pad 213 shown in FIG. 6 can be analogically reasoned by referring to the related descriptions of the anti-fuse unit 110, the reading switch 211, the blowing switch 212, and the blown pad 213 shown in FIG. 3, which are not repeated herein. In the embodiment shown in FIG. 6, the anti-fuse unit 110 includes the anti-fuse AF11, the anti-fuse AF12, and an anti-fuse AF61. The anti-fuses AF11 and AF12 shown in FIG. 6 can be analogically reasoned by referring to the related descriptions of the anti-fuses AF11 and AF12 shown in FIG. 3, which are not repeated herein. The first terminal of the anti-fuse AF61 is coupled to the first terminal of the anti-fuse AF11. The second terminal of the anti-fuse AF61 is coupled to the second terminal of the anti-fuse AF11.

In summary, the anti-fuse unit 110 described in the embodiments includes multiple anti-fuses, such as the anti-fuses AF11 and AF12 connected in series. When one of the anti-fuses in the anti-fuse unit 110 in the unblown state is un-expected blown, the equivalent resistance value of the anti-fuse unit 110 can still be maintained in the high resistance state to correctly indicate the "un-blown state". Therefore, the anti-fuse unit 110 can improve the robustness of the anti-fuse latch information.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. An anti-fuse device, comprising:
an anti-fuse unit, wherein the anti-fuse unit comprises a first anti-fuse and a second anti-fuse connected in series between a first terminal of the anti-fuse unit and a second terminal of the anti-fuse unit; and
a sensing circuit coupled to the first terminal and the second terminal of the anti-fuse unit for sensing a blown state of the anti-fuse unit,
wherein the sensing circuit comprises:
a first reading switch comprising a first terminal and a second terminal coupled to the first terminal of the anti-fuse unit and a reference voltage source, respectively;
a second reading switch comprising a first terminal coupled to the second terminal of the anti-fuse unit, wherein the first reading switch and the second reading switch are turned on when the anti-fuse unit is read, and the first reading switch and the second reading switch are turned off when the anti-fuse unit is not read; and
a reading circuit, coupled to a second terminal of the second reading switch, and configured for sensing the blown state of the anti-fuse unit when the second reading switch is turned on,
wherein the reading circuit comprises:
a reading resistor comprising a first terminal and a second terminal coupled to a power voltage source and the second terminal of the second reading switch, respectively;
a third reading switch comprising a first terminal coupled to the second terminal of the second reading switch, wherein the third reading switch is turned on when the anti-fuse unit is read; and
a latch circuit coupled to a second terminal of the third reading switch.

2. The anti-fuse device according to claim 1, wherein a first terminal of the first anti-fuse is coupled to the first terminal of the anti-fuse unit, a second terminal of the first anti-fuse is coupled to a first terminal of the second anti-fuse, and a second terminal of the second anti-fuse is coupled to the second terminal of the anti-fuse unit.

3. The anti-fuse device according to claim 2, wherein the anti-fuse unit further comprises:
a third anti-fuse, wherein a first terminal of the third anti-fuse is coupled to the first terminal of the first anti-fuse, and a second terminal of the third anti-fuse is coupled to the second terminal of the first anti-fuse.

4. The anti-fuse device according to claim 2, wherein the anti-fuse unit further comprises:
a third anti-fuse, wherein a first terminal of the third anti-fuse is coupled to the first terminal of the first anti-fuse, and a second terminal of the third anti-fuse is coupled to the second terminal of the second anti-fuse.

5. The anti-fuse device according to claim 2, wherein the anti-fuse unit further comprises:
a third anti-fuse, wherein a first terminal of the third anti-fuse is coupled to the first terminal of the first anti-fuse; and
a fourth anti-fuse, wherein a first terminal of the fourth anti-fuse is coupled to a second terminal of the third anti-fuse, and a second terminal of the fourth anti-fuse is coupled to the second terminal of the second anti-fuse.

6. The anti-fuse device according to claim 1, further comprising:
a blown pad, coupled to the first terminal of the anti-fuse unit, and configured for being coupled to an external blowing voltage source when the anti-fuse unit is blown; and
a blowing switch comprising a first terminal and a second terminal coupled to the second terminal of the anti-fuse unit and the reference voltage source, respectively, wherein the blowing switch is turned on when the anti-fuse unit is blown, and the blowing switch is turned off when the anti-fuse unit is not blown.

* * * * *